(12) United States Patent
Tsai et al.

(10) Patent No.: US 7,071,856 B2
(45) Date of Patent: Jul. 4, 2006

(54) PIPELINE ADC CALIBRATING METHOD AND APPARATUS THEREOF

(75) Inventors: Jui-Yuan Tsai, Tai-Nan (TW); Wen-Chi Wang, Yun-Lin Hsien (TW); Chia-Liang Chiang, Taipei Hsien (TW); Chao-Cheng Lee, Hsin-Chu (TW)

(73) Assignee: Realtek Semiconductor Corp., HsinChu (TW)

( * ) Notice: Subject to any disclaimer, the term of this patent is extended or adjusted under 35 U.S.C. 154(b) by 0 days.

(21) Appl. No.: 10/907,673

(22) Filed: Apr. 12, 2005

(65) Prior Publication Data

US 2005/0225462 A1 Oct. 13, 2005

(30) Foreign Application Priority Data

Apr. 13, 2004 (TW) ................. 93110261 A

(51) Int. Cl.
*H03M 1/10* (2006.01)
*H03M 1/38* (2006.01)
*H03M 3/00* (2006.01)

(52) U.S. Cl. .................. 341/120; 341/143; 341/161
(58) Field of Classification Search ................ 341/120, 341/118, 143, 155, 161, 162; 375/244, 247; 708/307

See application file for complete search history.

(56) References Cited

U.S. PATENT DOCUMENTS

| | | | | |
|---|---|---|---|---|
| 5,499,027 A | | 3/1996 | Karanicolas et al. ........ 341/120 |
| 5,572,212 A | * | 11/1996 | Levinson et al. ........... 341/162 |
| 5,936,562 A | * | 8/1999 | Brooks et al. .............. 341/143 |
| 5,982,313 A | * | 11/1999 | Brooks et al. .............. 341/143 |
| 6,184,809 B1 | * | 2/2001 | Yu ............................. 341/120 |
| 6,222,471 B1 | * | 4/2001 | Nagaraj ...................... 341/120 |
| 6,369,744 B1 | | 4/2002 | Chuang ...................... 341/161 |
| 6,384,757 B1 | * | 5/2002 | Kosonen ..................... 341/120 |
| 6,501,400 B1 | * | 12/2002 | Ali ............................. 341/118 |
| 6,507,305 B1 | * | 1/2003 | Andre et al. ................ 341/161 |
| 6,606,042 B1 | * | 8/2003 | Sonkusale et al. ......... 341/120 |
| 6,686,860 B1 | * | 2/2004 | Gulati et al. ............... 341/155 |
| 6,734,818 B1 | * | 5/2004 | Galton ........................ 341/161 |
| 6,762,707 B1 | * | 7/2004 | Wolf et al. ................. 341/155 |
| 6,784,814 B1 | * | 8/2004 | Nair et al. .................. 341/118 |
| 6,891,490 B1 | * | 5/2005 | Hales ......................... 341/155 |
| 6,914,549 B1 | * | 7/2005 | Chen et al. ................. 341/155 |
| 6,970,120 B1 | * | 11/2005 | Bjornsen .................... 341/120 |
| 2005/0083220 A1 | * | 4/2005 | Siferd et al. ................ 341/143 |

* cited by examiner

*Primary Examiner*—Patrick Wamsley
(74) *Attorney, Agent, or Firm*—Winston Hsu

(57) ABSTRACT

A pipeline ADC has a plurality of analog-to-digital conversion units cascaded in series to form a pipeline. An error correcting method for the pipeline ADC includes during a first mode, measuring the plurality of analog-to-digital conversion units utilizing an extra analog-to-digital conversion module; calculating a plurality of correction constant sets according to digital output values of the extra analog-to-digital conversion module in the measuring step; and during a second mode, correcting output signals of the plurality of analog-to-digital conversion units according to the correction constant sets.

11 Claims, 4 Drawing Sheets

| $V_{IP}$ | $V_{BIAS}$ | $V_{ON}$ | $\Sigma\triangle OUT$ |
|---|---|---|---|
| $+V_{ref}/4$ | $-V_{ref}$ | $2V_{in}-V_{ref}$ | S2[ ] |
| $+V_{ref}/4$ | 0 | $2V_{in}$ | S1[ ] |
| $-V_{ref}/4$ | 0 | $2V_{in}$ | S4[ ] |
| $-V_{ref}/4$ | $+V_{ref}$ | $2V_{in}+V_{ref}$ | S3[ ] |

Fig. 3

PIPELINE ADC CALIBRATING METHOD AND APPARATUS THEREOF

BACKGROUND OF INVENTION

1. Field of the Invention

The present invention relates to an analog-to-digital converter (ADC) calibrating method and an apparatus thereof, and more particularly, to a digitally calibrating method for a pipeline ADC and an apparatus thereof.

2. Description of the Prior Art

A pipeline analog-to-digital converter (ADC) is typical of an ADC for high speed and high resolution analog-to-digital conversion. Without the use of trimming or calibration techniques such as analogue calibration or digital calibration, the resolution of the pipeline ADC only approaches a degree of ten to twelve bits due to limitations such as capacitance mismatch induced during manufacturing, or a limited gain value of an operational amplifier. Additional circuitries or calibration techniques are required for implementing an ADC of higher resolution having more bits.

Please refer to U.S. Pat. No. 5,499,027 and U.S. Pat. No. 6,369,744, the contents of which are incorporated herein by reference. In the two patents mentioned above, pipeline ADCs including digitally self-calibrating functionality and related circuits thereof are disclosed. According to the above-mentioned patents, an ADC includes a pipeline structure. This pipeline structure includes a plurality of stages of analog-to-digital conversion units including an input stage, and a plurality of subsequent stages. Calibration of a specific stage of the analog-to-digital conversion units can eliminate errors caused by the limitations mentioned above. The ADC therefore also includes a calibration unit which corresponds to the specific stage of the analog-to-digital conversion units. The ADC utilizes conversion units of later stages out of the analog-to-digital conversion units, the calibration unit, and a set of calibration parameters corresponding to the specific stage of the analog-to-digital conversion units in order to calibrate the specific stage of the analog-to-digital conversion units.

In a calibration setup mode, the set of calibration parameters are derived by setting input signals of the specific stage of the analog-to-digital conversion units to be predetermined values, recording the output values of later stages, and performing proper calculations. Through this design, the set of calibration parameters are measured under the same conditions as that of a run mode, so as to precisely represent errors existed due to the circuits of the ADC.

The self-calibrating method mentioned above utilizes the conversion units of later stages out of the analog-to-digital conversion units in the pipeline structure in order to calibrate the specific stage of the analog-to-digital conversion units. It is therefore necessary that the precision of the conversion units of later stages approaches a certain degree in order to perform the calibration processes. To reach this goal, the circuits of the pipeline structure become much more power consuming or area-occupying (since better capacitor matching translates to larger capacitor area), or alternatively the circuits become much more complicated, or the error measurement or calibration are much more time-consuming.

SUMMARY OF INVENTION

It is therefore an objective of the present invention to provide a digitally self-calibrating pipeline analog-to-digital converter (ADC), which utilizes an extra analog-to-digital conversion module, and a related method thereof.

According to an exemplary embodiment of the present invention, an error correcting method for a pipeline ADC is disclosed. The pipeline ADC has a plurality of analog-to-digital conversion units cascaded in series to form a pipeline. The method includes the following steps: during a first mode, measuring the plurality of analog-to-digital conversion units utilizing an extra analog-to-digital conversion module; calculating a plurality of correction constant sets according to digital output values of the extra analog-to-digital conversion module in the measuring step; and during a second mode, correcting output signals of the plurality of analog-to-digital conversion units according to the correction constant sets.

According to another exemplary embodiment of the present invention, a digitally calibrated pipeline ADC is disclosed for converting an analog input signal into a digital output signal. The pipeline ADC includes a plurality of analog-to-digital conversion units cascaded in series forming a pipeline and including a plurality of digital output ends; an extra analog-to-digital conversion module coupled to the pipeline for measuring the plurality of analog-to-digital conversion units during a first mode; and a correction unit coupled to the analog-to-digital conversion units and the extra analog-to-digital conversion module. The correction unit corrects signals at the digital output ends during a second mode according to results of the measurement performed by the extra analog-to-digital conversion module in order to generate the digital output signal.

These and other objectives of the present invention will no doubt become obvious to those of ordinary skill in the art after reading the following detailed description of the preferred embodiment that is illustrated in the various figures and drawings.

BRIEF DESCRIPTION OF DRAWINGS

FIG. 3 is a measurement condition table utilized by the apparatus shown in FIG. 2.

DETAILED DESCRIPTION

Figure 1:
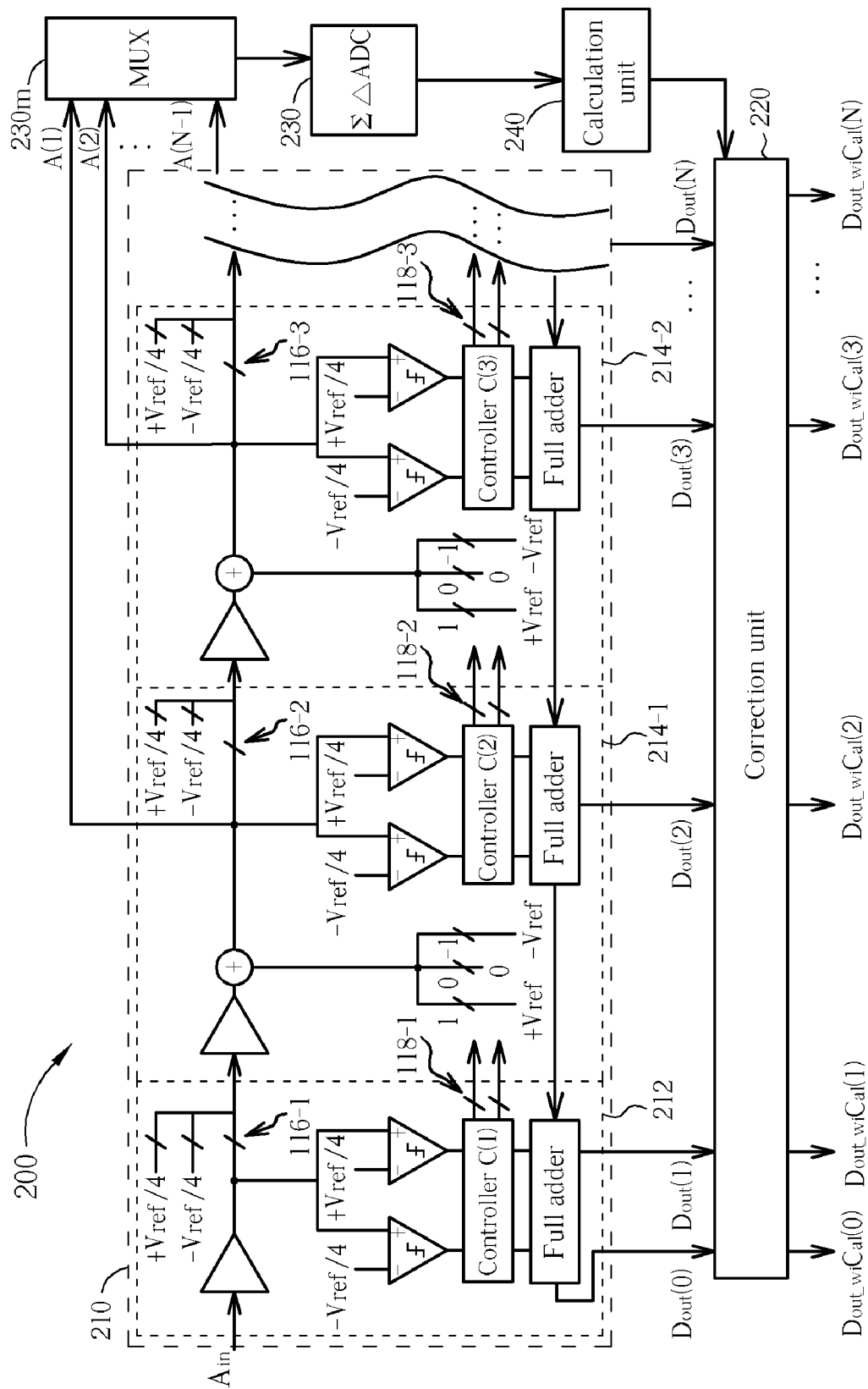
FIG. 1 is a diagram of a digitally calibrated pipeline analog-to-digital converter (ADC) according to an embodiment of the present invention.

Please refer to FIG. 1, which is a diagram of a digitally calibrated pipeline analog-to-digital converter (ADC) 200 according to an embodiment of the present invention. The pipeline ADC 200 includes a pipeline structure 210 (which can be referred to as a "pipeline"). The pipeline structure 210 includes an input stage 212 and a plurality of subsequent stages 214-1, 214-2 . . . , 214-N cascading in series as shown in FIG. 1. The pipeline ADC 200 further includes a correction unit 220 for correcting digital output values (i.e. digital output signals) of the pipeline structure 210 according to a plurality of correction constant sets. In the following description of this embodiment, the pipeline ADC 200 is illustrated using a structure of 1.5 bits/stage, wherein circuit configurations and operation principles thereof are well known in the art and are therefore not explained herein. Please note that those skilled in the art should be able to appreciate that in addition to 1.5 bit/stage, the inventive method and apparatus can also be used in a 1 bit/stage or multi-bit/stage architecture according to different embodiments of the present invention.

In addition to the components mentioned above, the pipeline ADC 200 further includes an extra analog-to-digital conversion module 230 selectively coupled to an analog output end of a subsequent stage 214-*l* out of the subsequent stages 214-1, 214-2 . . . 214-(N-1) through a multiplexer 230*m* for performing calibration on the subsequent stage 214-I, where I=1, 2, . . . , or N-1. The pipeline ADC 200 further includes a calculation unit 240, which is coupled to a digital output end of the extra analog-to-digital conversion module 230, in order to perform proper calculations on a digital output value of the extra analog-to-digital conversion module 230 and then generate the correction constants (i.e. the plurality of correction constant sets mentioned above). Please note, in this embodiment, the extra analog-to-digital conversion module 230 is implemented utilizing a sigma-delta ADC having advantages such as high resolution and small circuit area. However, those skilled in the art should understand that this is not a limitation of the present invention. As long as the implementation of the present invention is un-hindered, other kinds of ADC can be applied to other pipeline ADCs according to different embodiments of the present invention.

Operations of the digitally calibrated pipeline ADC 200 are involved with a calibration setup mode and a run mode. During the calibration setup mode, the pipeline ADC 200 utilizes switches 116-I and 118-I to respectively connect input ends of the subsequent stage 214-I (where I=1, 2, . . . , or N-1) to be calibrated to predetermined values such as the reference voltage +Vref/4, the reference voltage −Vref/4, and the control signals C(I) generated by the controller of the subsequent stage 214-I. In addition, the pipeline ADC 200 utilizes the multiplexer 230*m* to couple the analog output end of a subsequent stage 214-I to an input end of the extra analog-to-digital conversion module 230. As a result, the pipeline ADC 200 is capable of utilizing the calculation unit 240 to calculate the correction constants corresponding to each subsequent stage 214-I according to the digital output value ΣΔOUT of the extra analog-to-digital conversion module 230. On the other hand, during the run mode, the pipeline ADC 200 utilizes the correction unit 220 to correct the digital output values outputted by the pipeline structure 210 according to the correction constants derived from the calibration setup mode. As a result, influence of errors due to the circuits of the pipeline ADC 200 can be decreased or eliminated.

Figure 2:
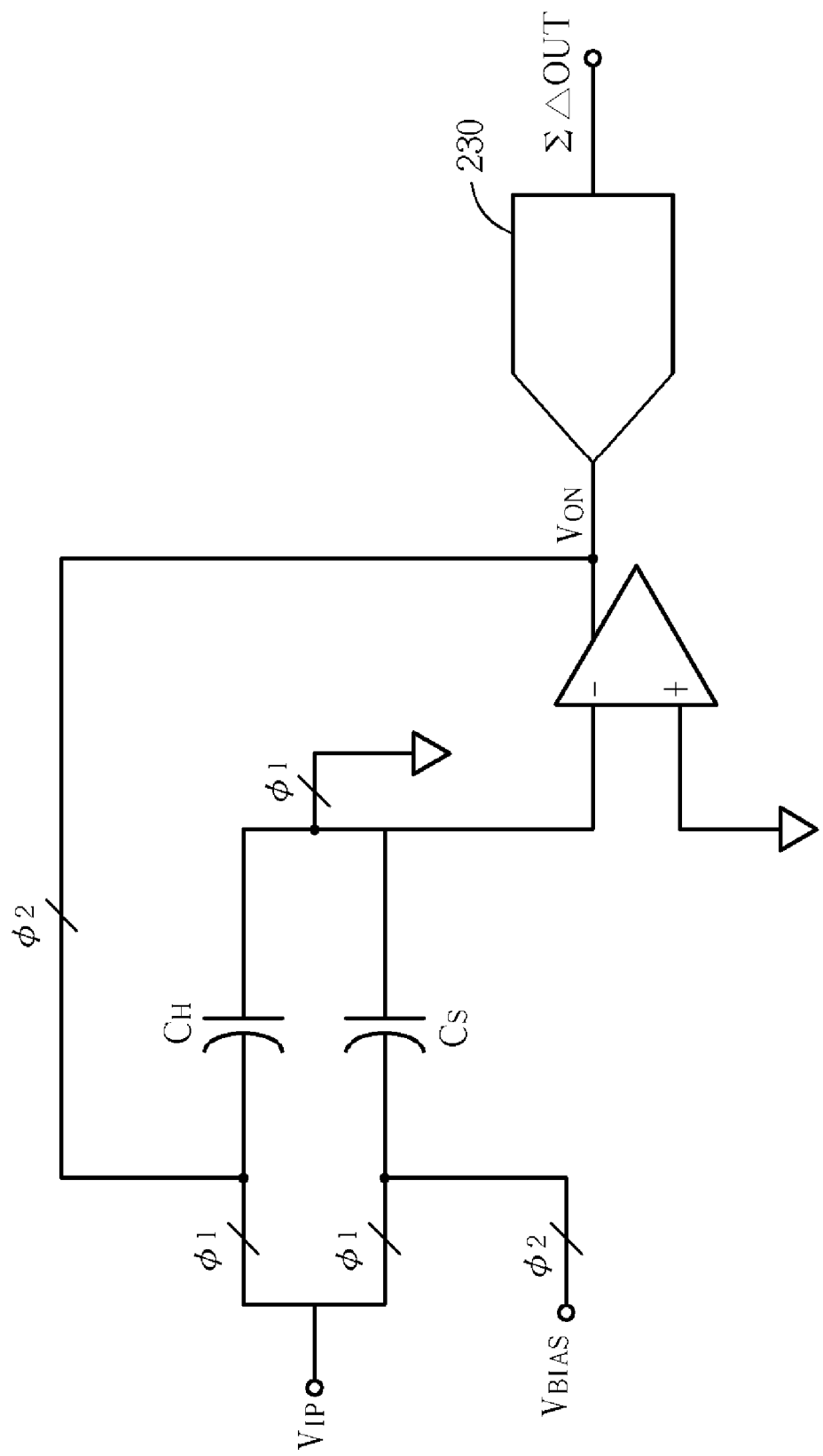
FIG. 2 is a diagram of a subsequent stage in the pipeline structure shown in FIG. 1 and the extra analog-to-digital conversion module utilized according to an embodiment of the present invention.

FIG. 2 illustrates a diagram of the subsequent stage 214-I to be calibrated and the extra analog-to-digital conversion module 230 utilized during the calibration setup mode mentioned above. As shown in FIG. 2, the signals φ1 and φ2 for controlling a plurality of switches activate alternatively, and the operation principles of these signals (φ1 and φ2) and the corresponding switches are well known in the art. In the following, operation principles of the calculation unit 240 shown in FIG. 1 are described in detail utilizing FIG. 2 according to an example. Firstly, assume that in this embodiment, the pipeline structure 210 includes fourteen stages (i.e. one input stage and thirteen subsequent stages), and that influence of output values of the subsequent stages 214-4, 214-5, . . . , 214-13 are negligible since errors are insignificant with respect to those of the other subsequent stages. In this situation, it is unnecessary to calibrate the output values of those later stages, and calculations of the correction constants of the subsequent stages 214-1, 214-2, 214-3, and 214-4 are described as follows.

While calculating the correction constants [CALA(I), CALB(I)] corresponding to the subsequent stage 214-I, measurement conditions shown in FIG. 3 should be applied to the circuitry shown in FIG. 2. As shown in FIG. 3, the measurement conditions includes the voltage inputted into the analog input end $V_{IP}$, the fixed bias $V_{BIAS}$ controlled by the control signals C(I) inputted into the digital input ends, and the voltage outputted from the analog output end VON derived from the setup mentioned above. Please refer to the measurement condition table shown in FIG. 3 by rows. After respectively reading the values S1(I), S2(I), S3(I), and S4(I) from the digital output end ΣΔOUT of the extra analog-to-digital conversion module 230, the calculation unit 240 calculates a plurality of parameters ERA(I) and ERB(I) according to the following equations:

$$ERA(I)=S1(I)-S2(I)$$

$$ERB(I)=S3(I)-S4(I)$$

The measurement conditions mentioned above and meanings of the parameters ERA(I) and ERB(I) are well known in the art and therefore have no need to be explained herein.

Figure 4:
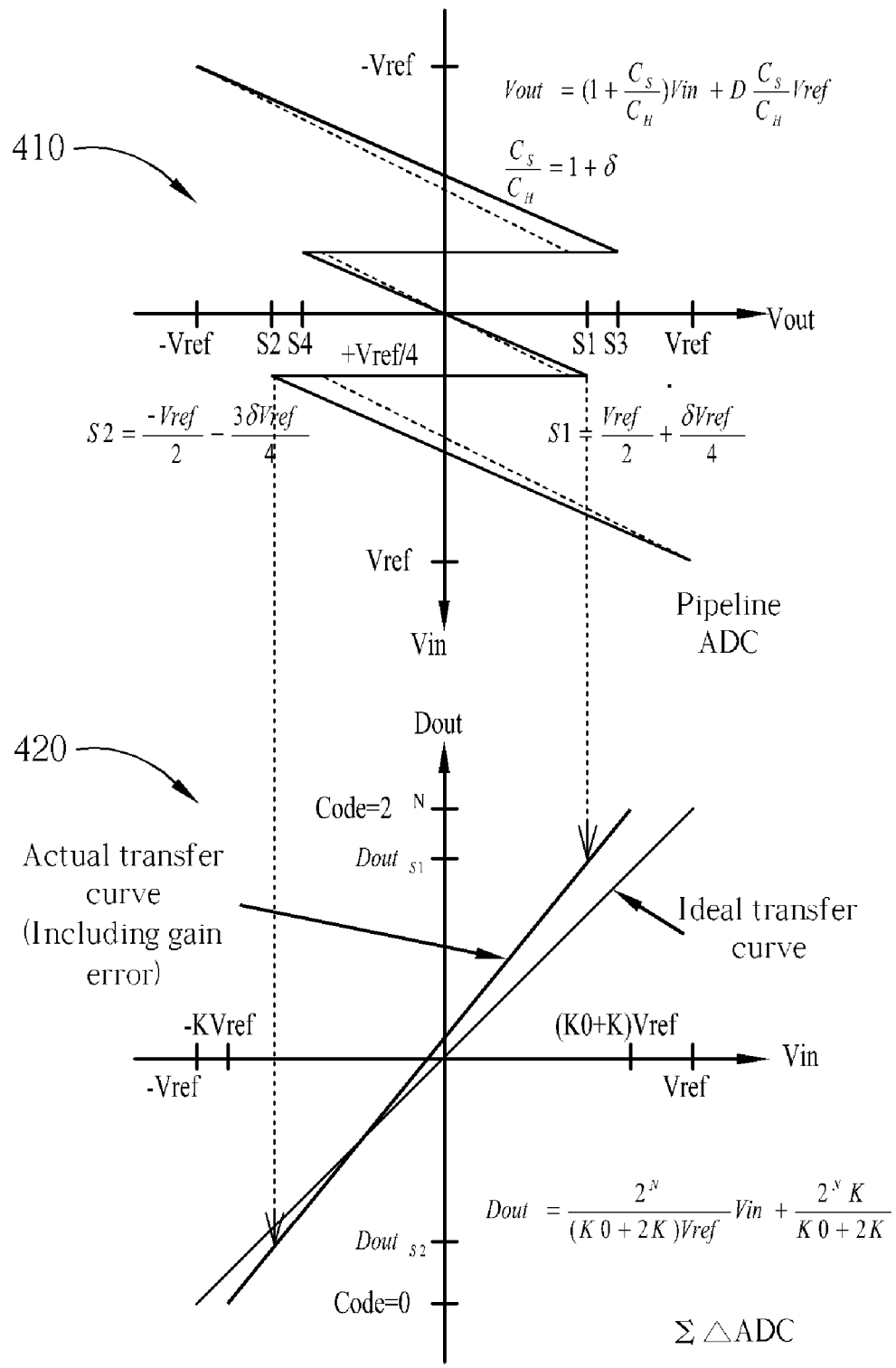
FIG. 4 is a diagram of transfer curves of the pipeline structure and the extra analog-to-digital conversion module shown in FIG.1.

Please refer to FIG. 4, which simultaneously illustrates transfer curves 410 of the subsequent stage 214-I of the pipeline structure 210 (where stage 214-I is being measured) and transfer curves 420 of the extra analog-to-digital conversion module 230. The transfer curves 410 include an ideal transfer curve, which is drawn with dashed lines, representing that no error occurs. As shown in FIG. 4, the transfer curves 410 further include a actual transfer curve, which is drawn with bold lines, representing that the influence of errors due to certain reasons such as capacitor mismatch in the subsequent stage 214-I is considered. In addition, the transfer curves 420 include an ideal transfer curve, which is drawn with a fine line, representing that no error occurs. As shown in FIG. 4, the transfer curves 420 further include an actual transfer curve, which is drawn with a bold line, representing the influence of gain errors and offset errors between the extra analog-to-digital conversion module 230 and lower stages in the pipeline structure 210. Significances of the transfer curves shown in FIG. 4 are well known in the art, and are as those illustrated in U.S. Pat. No. 5,499,027 and U.S. Pat. No. 6,369,744.

In order to fully describe the gain errors and the offset errors, two parameters K0 and K are introduced in the following. The transfer function of the actual transfer curve in the transfer curves 420 can be described utilizing the following equation:

$$Dout = \frac{2^{(N-1)}}{(K0+2K)Vref}Vin + \frac{2^{(N-1)}K}{K0+2K} \quad (1)$$

In Equation (1), Dout is the digital output value of the extra analog-to-digital conversion module 230, Vin is the input signal of the extra analog-to-digital conversion module 230, and N is the number of stages of the pipeline structure 210. In this embodiment, the number of stages is fourteen.

As shown by the transfer curves 410, in order to describe the influence of errors due to the circuits of the subsequent stage 214-I, an error parameter δ is introduced in the following. Corresponding to the values S1 and S2, the input signal Vin of the extra analog-to-digital conversion module 230 can be described according to the following equations:

$$Vin_{S1} = \frac{Vref}{2} + \frac{\delta Vref}{4}$$

$$Vin_{S2} = -\frac{Vref}{2} - \frac{3\delta Vref}{4}$$

By substituting the two equations mentioned above into Equation (1), the following equations are derived:

$$Dout_{S1} = \frac{2^{(N-1)}}{K0+2K}\frac{1}{2} + \frac{2^{(N-1)}K}{K0+2K} + \frac{2^{(N-1)}}{K0+2K}\frac{\delta}{4}$$

$$Dout_{S2} = \frac{2^{(N-1)}}{K0+2K}\frac{-1}{2} + \frac{2^{(N-1)}K}{K0+2K} - \frac{2^{(N-1)}}{K0+2K}\frac{3\delta}{4}$$

Since $ERA = Dout_{S1} - Dout_{S2}$, Equation (2) can be derived as follows:

$$ERA = Dout_{S1} - Dout_{S2} = \frac{2^{(N-1)}}{K0+2K} + \frac{2^{(N-1)}\delta}{K0+2K} \quad (2)$$

In order to utilize the calculation unit 240 to derive the correction constants [CALA(I), CALB(I)], it is desirable to remove the errors shown in the transfer curves 410 as well as in the transfer curves 420 (i.e. K0 and K) utilizing calculations. In this embodiment, the errors represented by the transfer curves 420 are handled first. For the ideal case, the values of the two parameters K0 and K and the parameter ERA in Equation (2) are listed as follows:

$K0 = 0$ $K = 1$ $ERA = 2^{(N-I-1)} + 2^{(N-I-1)}\delta$

Considering the first four stages to be calibrated, i.e., 214-1, 214-2, 214-3, and 214-4, the following equations can be derived:

$ERA(4) - 2^9 = 2^9 \delta_4$ $ERA(3) - 2^{10} = 2^{10}\delta_3$ $ERA(2) - 2^{11} = 2^{11}\delta_2$ $ERA(1) - 2^{12} = 2^{12}\delta_1 \quad (3)$ where $\delta_1, \delta_2, \delta_3, \delta_4$ are errors of the first, the second, the third, and the fourth stages respectively in the pipeline structure 210. For the actual case, however, the two parameters K0 and K are not negligible. Considering the first four stages again, the following equations can be derived:

$$ERA(4) = \frac{2^{10}}{K0+2K} + \frac{2^{10}\delta_4}{K0+2K} \quad (4)$$

$$ERA(3) = \frac{2^{11}}{K0+2K} + \frac{2^{11}\delta_3}{K0+2K}$$

$$ERA(2) = \frac{2^{12}}{K0+2K} + \frac{2^{12}\delta_2}{K0+2K}$$

$$ERA(1) = \frac{2^{13}}{K0+2K} + \frac{2^{13}\delta_1}{K0+2K}$$

According to the previously mentioned assumption that the influence of output values of the subsequent stages 214-4, 214-5, ..., 214-13 are negligible, the error$\delta_4$ can be set as zero. In order to utilize calculations of the calculation unit 240 to derive ideal values that will not be affected by the errors according to the actual measurement values as shown in Equations (4), the calculation unit 240 in this embodiment can perform the calculation according to the following equations:

$ERA\_Cal(4) = 0$ $ERA\_Cal(3) = \text{Round}(ERA(3)/ERA(4)*512 - 1024)$ $ERA\_Cal(2) = \text{Round}(ERA(2)/ERA(4)*512 - 2048)$ $ERA\_Cal(1) = \text{Round}(ERA(1)/ERA(4)*512 - 4096)$ ERA_Cal(I) mentioned above represents intermediate constants derived after removing the errors represented by the transfer curve 420, and Round( ) represents the function of performing the function of rounding off. In a similar way, the following equations can be derived:

$ERB\_Cal(4) = 0$ $ERB\_Cal(3) = \text{Round}(ERB(3)/ERB(4)*512 - 1024)$ $ERB\_Cal(2) = \text{Round}(ERB(2)/ERB(4)*512 - 2048)$ $ERB\_Cal(1) = \text{Round}(ERB(1)/ERB(4)*512 - 4096)$ After utilizing the calculations mentioned above to remove the gain errors and the offset errors between the extra analog-to-digital conversion module 230 and the later stages in the pipeline 210, the calculation unit further performs calculations to compensate for influence caused the errors of the later stages in the pipeline structure 210. In this embodiment, the calculation unit 240 is capable of calculating a plurality of intermediate constants ERA_Cal_Add(I) and ERB_Cal_Add(I) for compensating the influence caused by the errors of the later stages in the pipeline structure 210. These calculations can be described utilizing the following equations:

$ERA\_Cal\_Add(4) = ERA\_Cal(4)$ $ERB\_Cal\_Add(4) = ERB\_Cal(4)$ $ERA\_Cal\_Add(3) = ERA\_Cal(3) = ERA\_Cal(4)$ $ERB\_Cal\_Add(3) = ERB\_Cal(3) - ERB\_Cal(4)$ $ERA\_Cal\_Add(2) = ERA\_Cal(2) - ERA\_Cal(3)$ $ERB\_Cal\_Add(2) = ERB\_Cal(2) - ERB\_Cal(3)$ $ERA\_Cal\_Add(1) = ERA\_Cal(1) - ERA\_Cal(2)$ $ERB\_Cal\_Add(1) = ERB\_Cal(1) - ERB\_Cal(2)$

After calculating the intermediate constants ERA_Cal_Add(I) and ERB_Cal_Add(I), the calculation unit 240 can then generate the correction constant sets CALA(I) and CALB(I) (where I=1, 2, 3, 4 for this situation since the values of the later stages are negligible) utilizing the transfer equations described as follows:

$CALA(4)=ERA\_Cal\_Add(4)$ $CALB(4)=ERB\_Cal\_Add(4)$ $CALA(3)=ERA(3)\_Cal\_Add+CALA(4)+CALB(4)$ $CALB(3)=ERB(3)\_Cal\_Add+CALA(4)+CALB(4)$ $CALA(2)=ERA(2)\_Cal\_Add+CALA(3)+CALB(3)$ $CALB(2)=ERB(2)\_Cal\_Add+CALA(3)+CALB(3)$ $CALA(1)=ERA(1)\_Cal\_Add+CALA(2)+CALB(2)$ $CALB(1)=ERB(1)\_Cal\_Add+CALA(2)+CALB(2)$

Finally, operation principles of the correction unit 220 during the run mode are described in the following. The correction unit 220 is capable of correcting signals (i.e. output values Dout(I)) at the digital output ends of the pipeline structure 210 during the run mode, according to the correction constants CALA(I) and CALB(I), to generate corrected digital values Dout_wiCal(0)~Dout_wiCal(N) of the digital output signal Dout_wiCal of the pipeline ADC 200. After the calculation unit 230 derives the correction constants CALA(I) and CALB(I) during the calibration setup mode, the correction unit 220 can generate all bits Dout_wiCal(I) (I=1, 2, . . . , N) of the digital output signal Dout_wiCal during the run mode as follows:

if $C(I)=-1$, then $Dout\_wiCal(I)=D(I)-CALB(I)$;

if $C(I)=0$, then $Dout\_wiCal(I)=D(I)$;

if $C(I)=+1$, then $Dout\_wiCal(I)=D(I)+CALA(I)$.

Please note that the operations of the calculation unit 230 and the correction unit 220 mentioned above are described according to merely one embodiment of the present invention. Those skilled in the art should understand that as long as the implementation of the present invention is un-hindered, various kinds of architectures and methods thereof can be applied to other embodiments of the present invention.

Those skilled in the art will also readily observe that numerous modifications and alterations of the device and method may be made while retaining the teachings of the invention. Accordingly, the above disclosure should be construed as limited only by the metes and bounds of the appended claims.

What is claimed is:

1. An error correcting method for a pipeline analog-to-digital converter (ADC), the pipeline ADC having a plurality of analog-to-digital conversion units cascaded in series to form a pipeline having an input state and a plurality of subsequent stages, the method comprising the following steps:

during a first mode, multiplexing analog outputs of the subsequent stages to output each analog output to an extra analog-to-digital conversion module, and generating digital output values according to the analog outputs by utilizing the extra analog-to-digital conversion module;

calculating a plurality of correction constant sets according to the digital output values; and during a second mode, correcting output signals of the plurality of analog-to-digital conversion units according to the correction constant sets.

2. The method of claim 1, wherein the pipeline ADC stops receiving analog input signals during the first mode, and the pipeline ADC receives analog input signals during the second mode.

3. The method of claim 1, wherein the extra analog-to-digital conversion module comprises a sigma-delta ADC.

4. The method of claim 1, wherein the step of calculating the plurality of correction constant sets further comprises:

performing calculations for removing errors between the extra analog-to-digital conversion module and the pipeline.

5. The method of claim 1, wherein the step of calculating the plurality of correction constant sets further comprises:

corresponding to each analog-to-digital conversion unit, performing calculations for compensating for influence of errors of lower stages in the pipeline.

6. A digitally calibrated pipeline analog-to-digital converter (ADC) for converting an analog input signal into a digital output signal, the pipeline ADC comprising:

a plurality of analog-to-digital conversion units cascaded in series forming a pipeline having an input state and a plurality of subsequent stages;

an extra analog-to-digital conversion module;

a multiplexer, coupled to the subsequent stages and the extra analog-to-digital conversion module, for multiplexing analog outputs of the subsequent stages to output each analog output to the extra analog-to-digital conversion module during a first mode, wherein the extra analog-to-digital conversion module measures the plurality of analog-to-digital conversion units to generate digital output values associated with the analog outputs during the first mode;

a correction unit coupled to the analog-to-digital conversion units and the extra analog-to-digital conversion module for correcting output signals of the plurality of analog-to-digital conversion units during a second mode according to results of the measurement performed by the extra analog-to-digital conversion module.

7. The pipeline ADC of claim 6, further comprising:

a calculation unit coupled to the extra analog-to-digital conversion module for calculating a plurality of correction constant sets according to the results of the measurement performed by the extra analog-to-digital conversion module.

8. The pipeline ADC of claim 7, wherein the calculation unit performs calculations for removing errors between the extra analog-to-digital conversion module and the pipeline.

9. The pipeline ADC of claim 7, wherein the calculation unit performs calculations for compensating for influence of errors of lower stages in the pipeline for each analog-to-digital conversion unit.

10. The pipeline ADC of claim 6, wherein the pipeline ADC stops receiving the analog input signal during the first mode, and the pipeline ADC receives the analog input signal during the second mode.

11. The pipeline ADC of claim 6, wherein the extra analog-to-digital conversion module comprises a sigma-delta ADC.

* * * * *